United States Patent
Liu

(10) Patent No.: US 11,387,239 B2
(45) Date of Patent: Jul. 12, 2022

(54) SEMICONDUCTOR MEMORY DEVICE STRUCTURE

(71) Applicant: Changxin Memory Technologies, Inc., Anhui (CN)

(72) Inventor: Chih Cheng Liu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 117 days.

(21) Appl. No.: 16/810,572

(22) Filed: Mar. 5, 2020

(65) Prior Publication Data

US 2020/0203353 A1    Jun. 25, 2020

Related U.S. Application Data

(63) Continuation of application No. PCT/CN2018/104308, filed on Sep. 6, 2018.

(30) Foreign Application Priority Data

Sep. 6, 2017 (CN) .......................... 201710796600.7

(51) Int. Cl.
*H01L 27/108* (2006.01)

(52) U.S. Cl.
CPC .. *H01L 27/10823* (2013.01); *H01L 27/10814* (2013.01); *H01L 27/10876* (2013.01); *H01L 27/10888* (2013.01)

(58) Field of Classification Search
CPC ......... H01L 27/10823; H01L 27/10814; H01L 27/10876; H01L 27/10888; H01L 29/4236
See application file for complete search history.

(56) References Cited

U.S. PATENT DOCUMENTS 8,933,508 B2    1/2015 Juengling
9,171,847 B1 *  10/2015 Lee ................... H01L 27/10823
(Continued)

FOREIGN PATENT DOCUMENTS

| CN | 101208795 A | 6/2008 |
| CN | 105826318 A | 8/2016 |

(Continued)

OTHER PUBLICATIONS

PCT International Search Report and the Written Opinion dated Nov. 29, 2018, issued in related International Application No. PCT/CN2018/104308 (9 pages).

(Continued)

*Primary Examiner* — Phat X Cao
(74) *Attorney, Agent, or Firm* — Sheppard Mullin Richter & Hampton LLP

(57) ABSTRACT

A transistor structure of a semiconductor memory device comprises: an active area having a plurality of trenches and a substrate surface, the trenches having openings oriented toward the substrate surface; a plurality of gate structures embedded in the trenches, wherein the substrate surface comprises source regions located on outer sides of the gate structures and a drain region located between the gate structures; node contacts each disposed on one of the source regions; a bit line contact disposed on the drain region and connectable to a bit line, the node contacts sharing the bit line contact through adjacent gate structures, wherein the drain region comprises a first ion implantation layer extending inwardly from the bit line contact, each of the source regions comprising a second ion implantation layer extending inwardly from a corresponding node contact, the first ion implantation layer being deeper than the second ion implantation layer.

26 Claims, 4 Drawing Sheets

(56) References Cited

U.S. PATENT DOCUMENTS

| | | | | |
|---|---|---|---|---|
| 2011/0057239 A1* | 3/2011 | Arao | ............ | H01L 28/75 |
| | | | | 257/296 |
| 2012/0273859 A1* | 11/2012 | Oyu | ............ | H01L 28/91 |
| | | | | 257/296 |
| 2013/0214338 A1* | 8/2013 | Mikasa | ............ | H01L 27/10876 |
| | | | | 257/296 |
| 2016/0260813 A1* | 9/2016 | Cho | ............ | H01L 29/4966 |

FOREIGN PATENT DOCUMENTS

| | | |
|---|---|---|
| CN | 107425072 A | 12/2017 |
| CN | 207165579 U | 3/2018 |

OTHER PUBLICATIONS

First Search dated Feb. 12, 2018, issued in related Chinese Application No. 201710796600.7 (1 page).

First Office Action dated Feb. 26, 2018, issued in related Chinese Application No. 201710796600.7, with English machine translation (11 pages).

Second Office Action dated Jun. 19, 2018, issued in related Chinese Application No. 201710796600.7, with English machine translation (11 pages).

* cited by examiner

US 11,387,239 B2

SEMICONDUCTOR MEMORY DEVICE STRUCTURE

CROSS-REFERENCE TO RELATED APPLICATIONS

This application is a continuation application of International Patent Application No. PCT/CN2018/104308, filed on Sep. 6, 2018, which is based on and claims priority of the Chinese Patent Application No. 201710796600.7, filed on Sep. 6, 2017 and entitled "SEMICONDUCTOR MEMORY DEVICE STRUCTURE." The above-referenced applications are incorporated herein by reference in their entirety.

TECHNICAL FIELD

The present disclosure relates to integrated circuits and, in particular, to a semiconductor memory device structure.

BACKGROUND

Dynamic random access memories (DRAMs) are commonly-used semiconductor memory devices. A DRAM generally includes a great number of identical memory cells, each cell typically comprising a capacitor and a transistor. The transistor has a gate connected to a word line, a drain connected to a bit line and a source connected to the capacitor. The transistor can be turned on or off by a voltage signal applied on the word line, allowing data information to be read from the capacitor via the bit line or written into and stored on the capacitor via the bit line.

A datum is stored in the capacitor in the form of an electric charge. Typically, absence of an electric charge represents "0", while presence of an electric charge represents "1", or vice versa. However, the capacitor and a PN junction coupled thereto usually suffer from a slight electric leakage. With time, the capacitor loses the electric charges stored in it until no electric charge is present. As a result, the datum stored in the capacitor is lost. Therefore, the DRAMs have to rewrite the information stored in the memory cells once every 2 to 4 millisecond, and such operations are referred to as "refreshing."

In existing DRAMs, if there is excessive coupling between adjacent word lines, a hammer process may cause memory cells to leak their charges into the connected devices. In particular, when a memory cell storing a datum "1" is adjacent to a memory cell storing a datum "0," the hammer process may cause migration of electrons from the memory cell storing the datum "0" into the memory cell storing the datum "1." Such an electric leakage between adjacent memory cells may accelerate failure of the memory cells.

Therefore, there is a critical need for new methods or device structures to address the problem of electric leakage in memory cell arrays.

SUMMARY

The present disclosure provides a transistor structure for a semiconductor memory device, comprising: an active area having a plurality of trenches and a substrate surface, the trenches having openings oriented toward the substrate surface; a plurality of gate structures embedded in the plurality of trenches of the active area, wherein the substrate surface comprises source regions located on outer sides of the gate structures and a drain region located between the gate structures; a plurality of node contacts each disposed on one of the source regions; and a bit line contact disposed on the drain region and connectable to a bit line of the semiconductor memory device, wherein the node contacts share the bit line contact through the gate structures adjacent to the node contacts respectively.

The drain region of the active area comprises a first ion implantation layer extending inwardly from the bit line contact, and each of the source regions of the active area comprises a second ion implantation layer extending inwardly from the one of the node contacts disposed on the each of the source regions. A first depth of the first ion implantation layer is greater than a second depth of the second ion implantation layer.

In some embodiments, each of the first ion implantation layer and the second ion implantation layer has a concentration decreasing from a surface thereof inwardly and gradually with a gradient, and a doping concentration of the first ion implantation layer is higher than a doping concentration of the second ion implantation layer.

In some embodiments, each of the first ion implantation layer and the second ion implantation layer is doped with an N-type dopant, and a bottom region of the active area other than the first and second ion implantation layers is doped with a P-type dopant.

In some embodiments, a depth of each of the gate structures in the active area is greater than each of the first depth of the first ion implantation layer and the second depth of the second ion implantation layer.

In some embodiments, each of the gate structures comprises a gate dielectric layer, a metal liner and a gate electrode.

Another aspect of the present disclosure provides a semiconductor memory device, comprising: an active area, a plurality of word lines buried in and crossing the active area, and a bit line located on the active area.

At least two transistors are embedded in the active area, and each of the transistors may include a plurality of gate structures embedded in the active area and integrated with one of the plurality of word lines. Each of the transistors may include a source region located on an outer side of the gate structure and a drain region located between gate structures of adjacent transistors. The source region may have a top connectable to a capacitor, the drain region may have a top connectable to the bit line, and two adjacent ones of the transistors may share a bit line contact connected to the bit line.

The drain region comprises a first ion implantation layer extending inwardly from the top of the drain region, and the source region comprises a second ion implantation layer extending inwardly from the top of the source region. A first depth of the first ion implantation layer may be greater than a second depth of the second ion implantation layer so as to provide a J-shaped transistor channel.

In some embodiments, each of the gate structures comprises an insulating cap layer formed thereon.

In some embodiments, the insulating cap layer covers tops of the gate dielectric layer, the metal liner and the gate electrode. The top of the gate dielectric layer may be flush with the top of the metal liner, the top of the gate electrode may be higher than the tops of the gate dielectric layer and the metal liner, and the top of the gate electrode may protrude into the insulating cap layer.

In addition, the present disclosure provides another transistor structure for a semiconductor memory device, comprising: an active area, comprising a plurality of trenches and a substrate surface, the trenches having openings oriented toward the substrate surface; a plurality of gate structures embedded in the plurality of trenches of the active area, wherein the substrate surface comprises source regions located on outer sides of the gate structures and a drain region located between the gate structures; a plurality of node contacts, each disposed on one of the source regions; and a bit line contact disposed on the drain region and connectable to a bit line of the semiconductor memory device, the node contacts sharing the bit line contact through the gate structures adjacent to the node contacts respectively.

The drain regions in the active area comprises a first ion implantation layer extending inwardly from the bit line contact, and the first ion implantation layer has a flat bottom. Each of the source regions of the active area comprises a second ion implantation layer extending inwardly from the one of the node contacts disposed on the each of the source regions. A first depth of the first ion implantation layer may be greater than a second depth of the second ion implantation layer. Each of the first ion implantation layer and the second ion implantation layer has a concentration decreasing from a surface thereof inwardly and gradually with a gradient.

In some embodiments, a doping concentration of the first ion implantation layer may be higher than a doping concentration of the second ion implantation layer.

In some embodiments, each of the first ion implantation layer and the second ion implantation layer is doped with an N-type dopant, and a bottom region of the active area other than the first and second ion implantation layers is doped with a P-type dopant.

In some embodiments, a depth of each of the gate structures in the active area is greater than each of the first depth of the first ion implantation layer and the second depth of the second ion implantation layer.

In some embodiments, each of the gate structures may comprise a gate dielectric layer, a metal liner and a gate electrode.

In some embodiments, the bottom of the first ion implantation layer is deeper than a top of the gate structure, and a side surface of the first ion implantation layer overlaps with a side surface of the gate structure to form a first overlapping area.

In some embodiments, the bottom of the second ion implantation layer is deeper than the top of the gate structure, and a side surface of the second ion implantation layer overlaps with another side surface of the gate structure to form a second overlapping area.

In some embodiments, the first overlapping area is larger than the second overlapping area.

In some embodiments, the second ion implantation layer has a flat bottom.

Yet another aspect of the present disclosure may provide a semiconductor memory device, comprising: an active area, a plurality of word lines buried in and crossing the active area, and a bit line located on the active area.

At least two transistors are embedded in the active area, each of the transistors may include a gate structure embedded in the active area and integrated with one of the plurality of word lines, each of the transistors may include a source region located on an outer side of the gate structure and a drain region located between gate structures of adjacent transistors. The source region may have a top connectable to a capacitor, the drain region may have a top connectable to the bit line, and two adjacent ones of the transistors may share a bit line contact connected to the bit line.

The drain region comprises a first ion implantation layer extending inwardly from the top of the drain region, and the bottom of the first ion implantation layer is flat. The source region comprises a second ion implantation layer extending inwardly from the top of the source region, a first depth of the first ion implantation layer may be greater than a second depth of the second ion implantation layer so as to form a J-shaped transistor channel Each of the first ion implantation layer and the second ion implantation layer has a concentration decreasing from a surface thereof inwardly and gradually with a gradient.

In some embodiments, a doping concentration of the first ion implantation layer is higher than a doping concentration of the second ion implantation layer.

In some embodiments, each of the first ion implantation layer and the second ion implantation layer is doped with an N-type dopant, and a bottom region of the active area other than the first and second ion implantation layers is doped with a P-type dopant.

In some embodiments, a depth of each of the gate structures in the active area is greater than each of the first depth of the first ion implantation layer and the second depth of the second ion implantation layer.

In some embodiments, each of the gate structures may comprise a gate dielectric layer, a metal liner layer and a gate electrode.

In some embodiments, each of the gate structures may comprise an insulating cap layer formed thereon.

In some embodiments, the insulating cap layer covers tops of the gate dielectric layer, the metal liner and the gate electrode, and the top of the gate dielectric layer may be flush with the top of the metal liner. The top of the gate electrode may be higher than the tops of the gate dielectric layer and the metal liner, and the top of the gate electrode may protrude into the insulating cap layer.

In some embodiments, the bottom of the first ion implantation layer is deeper than a top of the gate structure, and a side surface of the first ion implantation layer overlaps with a side surface of the gate structure to form a first overlapping area.

In some embodiments, the bottom of the second ion implantation layer is deeper than the top of the gate structure, and a side surface of the second ion implantation layer overlaps with another side surface of the gate structure to form a second overlapping area.

In some embodiments, the first overlapping area is larger than the second overlapping area.

In some embodiments, wherein the second ion implantation layer has a flat bottom.

The semiconductor memory device of the present disclosure offers the following benefits. The recessed gate structures of the transistor structure provide inwardly curved channels, so that the length of the channels can be effectively increased. Further, the multi-layer gate structures can reduce high electric field effects at the gates and reduce electric leakage. Additionally, sandwiching the gates between the unique asymmetric diffusion junctions can enlarge a travel distance of the interfering electric charges, from the word line of one transistor to the node contact of the adjacent transistor, thereby ameliorating electric leakage between adjacent memory cells and mitigating the problem of bit line failures.

Figure 1:
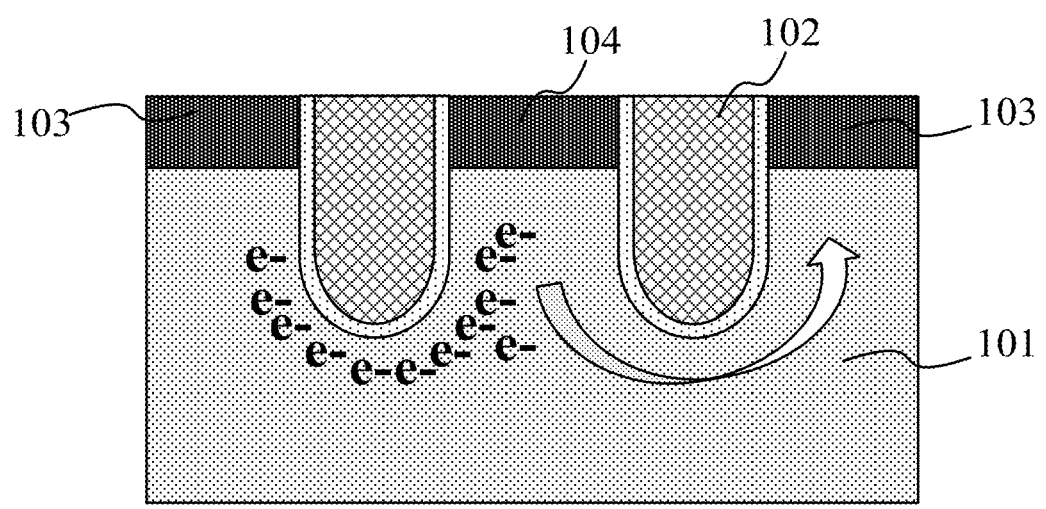
FIG. 1 is a schematic illustration of a conventional transistor structure for a semiconductor memory device.

A list of reference numerals is shown as below.

| | |
|---|---|
| 101, 201, 301 | active region |
| 102, 202, 302 | gate structure |
| 3021 | gate dielectric layer |
| 3022 | metal liner |
| 3023 | gate electrode |
| 103, 2031, 3031 | node contact |
| 104, 2041, 3041 | bit line contact |
| 2032, 3032 | second ion implantation layer |
| 2042, 3042 | First ion implantation layer |
| 305 | insulating cap layer |
| 300 | shallow trench isolation (STI) |

DETAILED DESCRIPTION

Embodiments of the present disclosure will be described below by way of embodiments and examples. Other advantages and benefits of the present application will be readily understood by those skilled in the art from the disclosure herein. The present disclosure may also be implemented or utilized through other embodiments different from the embodiments disclosed herein. Various modifications or changes may be made to the details disclosed herein from different views and for different applications without departing from the spirit of the present application. In addition, the following embodiments and the features thereof may be combined without any conflict preventing the combination.

The drawings are presented merely to illustrate the basic principles of the present disclosure in a schematic manner and therefore show only the components related hereto, which are not produced according to the quantities, shapes and sizes in actual implementations where their configurations, quantities and scales may vary arbitrarily and their arrangements may be more complex.

In existing dynamic random access memories (DRAMs), if there is excessive coupling between adjacent word lines, a hammer process may cause memory cells to leak their charges into the connected devices. In particular, when a memory cell storing a datum "1" is adjacent to a memory cell storing a datum "0," the hammer process may cause migration of electrons from the memory cell storing the datum "0" into the memory cell storing the datum "1." Such an electric leakage between adjacent memory cells may accelerate failure of the memory cells.

In order to circumvent such an electric leakage, the present disclosure proposes to sandwich the gate of a transistor in between two asymmetric diffusion junctions, among which, the diffusion junction that acts as a bit line contact has a depth in the active area greater than that of the other diffusion junction that acts as a node contact. The bit line contact is shared by two adjacent transistors. As the bit line contact between two adjacent transistors has a greater depth, the interfering electric charges may be present substantially on the side of the node contact of the transistors. This way, a travel distance of the interfering electric charges can be enlarged from the word line of the one of the transistors to the node contact of the other one of the transistors, thereby ameliorating electric leakage between adjacent memory cells and mitigating the problem of bit line failures.

FIG. 1 shows a conventional transistor structure for a semiconductor memory device, which includes: an active area 101; gate structures 102 within the active area 101; and a source and a drain region located on one side of each of the gate structures 102 respectively. Two node contacts 103 connectable to memory cells' capacitors are positioned in the source regions. A bit line contact 104 connectable to a bit line of the semiconductor memory device is positioned in the drain region. Each of the gate structures 102 is connected to a word line of the semiconductor memory device. Two adjacent gate structures 102 share a single bit line contact 104. Each of the gate structures 102 controls the capacitors of a corresponding one of the memory cells through a corresponding one of the node contacts 103.

When two adjacent gate structures 102 respectively control a memory cell storing a datum "1" and a memory cell storing a datum "0," interfering electric charges "e−" may appear around one of the adjacent gate structures 102. Under effect of voltage difference, the interfering electric charges "e−" may drift into the other one of the gate structures 102, resulting in failure of the corresponding memory cell. As shown in FIG. 1, the interfering electric charges "e−" are distributed around a bottom region of one of the gate structures 102. Those electric charges "e−" beneath the bit line contact 104 can easily migrate to the node contact 103 of the other one of the gate structures 102.

Figure 2:
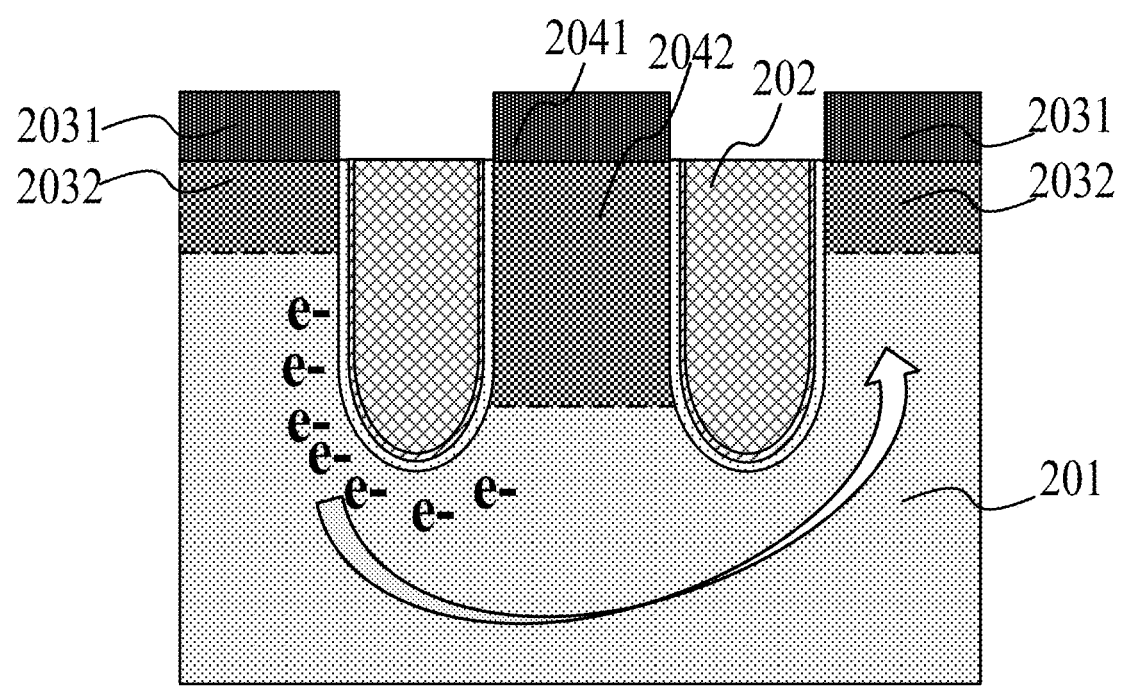
FIG. 2 schematically illustrates a transistor structure for a semiconductor memory device according to some embodiments of the present disclosure.

FIG. 2 shows a transistor structure for a semiconductor memory device in accordance with some embodiments of the present disclosure. The transistor structure may include: an active area 201, comprising a plurality of trenches and a substrate surface, the trenches having openings oriented toward the substrate surface; a plurality of gate structures 202 embedded in the trenches of the active area 201, where the substrate surface comprises source regions located on outer sides of the gate structures 202 and a drain region located between the gate structures 202; two node contacts 2031, each disposed on one of the source regions; and a bit line contact 2041, disposed on the drain region and connectable to a bit line of the semiconductor memory device, where the two node contacts 2031 share the bit line contact 2041 through the gate structures 202 adjacent to the node contacts 2031 respectively, The drain region of the active area 201 includes a first ion implantation layer 2042 extending inwardly from the bit line contact 2041, and first ion implantation layer 2042 has a flat bottom, and where each of the source regions of the active area 201 includes a second ion implantation layer 2032 extending inwardly from the one of the node contacts 2031 disposed on the each of the source regions, and second ion implantation layer 2032 also has a flat bottom, and where the depth of the first ion implantation layer 2042 is greater than the depth of the second ion implantation layer 2032.

In some embodiments, the bottom of the first ion implantation layer 2042 is deeper than a top of the gate structure 202. In addition, a side surface of the first ion implantation layer 2042 overlaps with a side surface of the gate structure 202 to form a first overlapping area. Similarly, the bottom of the second ion implantation layer 2032 is deeper than the top of the gate structure 202. A side surface of the second ion implantation layer 2032 overlaps with another side surface of the gate structure 202 to form a second overlapping area. In some embodiments, the first overlapping area is larger than the second overlapping area.

In some embodiments, each of the first ion implantation layer 2042 and the second ion implantation layers 2032 may have a concentration decreasing from a surface thereof inwardly and gradually with a gradient. For example, the concentration of either ion implantation layer 2042, 2032 may decrease with the depth from the surface of the layer 2042, 2032. The concentration has the highest value at the surface and the lowest value at the bottom of the layer 2042, 2032, and a gradient may be pre-defined for the decrease of the concentration of either ion implantation layer 2042, 2032.

In some embodiments, each of the first ion implantation layer 2042 and the second ion implantation layers 2032 may be formed by implanting a dose of dopant of a second conductivity type into the surface of the active area 201 that has a first conductivity type and causing the implanted dose of dopant to diffuse downwardly or inwardly. The first conductivity type may be a P type and the second conductivity type may be an N type. That is, each of the first ion implantation layer 2042 and the second ion implantation layers 2032 is doped with an N-type dopant, while a bottom region of the active area 201 other than the first and second ion implantation layers 2042, 2032 is doped with a P-type dopant.

In some embodiments, a doping concentration of the first ion implantation layer 2042 may be higher than a doping concentration of the second ion implantation layers 2032 so as to form two asymmetric diffusion junctions on two sides of each of the gate structures 202. The different diffusion depths may be realized through applying different doses of the dopant diffusing downwardly or inwardly. The dopant doses for the first ion implantation layer 2042 and the second ion implantation layers 2032 are not particularly limited herein and can be properly selected according to various practical needs.

Additionally, each of the gate structures 202 recessed down to the active area 201 allows an increase of a channel area, facilitating to achieve a higher drive current, a better device performance and an ameliorated electric leakage.

In some embodiments, the depth of each of the gate structures 202 recessed in the active area 201 may be greater than the depth of the first ion implantation layer 2042 and hence also greater than the depth of the second ion implantation layers 2032. In some embodiments, each of the gate structures 202 may have a multi-layer structure. For example, each of the gate structures 202 includes a gate dielectric layer on the exterior, a metal liner on the inner side of the gate dielectric layer and an gate electrode in the interior. The gate dielectric layer may be fabricated from a dielectric material or thermal oxide with a high dielectric constant, and the gate electrode from a metal such as tungsten. The materials used to make the layers of the gate structures 202 may be properly selected and combined based on various practical work functions.

As shown in FIG. 2, the interfering electric charges "e−" are mostly present on one side of the node contact 2031 of one of the transistors. The two node contacts 2031 of the two adjacent transistors are located on opposing ends. Between the two adjacent transistors, the first ion implantation layer 2042 is connected to the bit line contact 2041 shared by the two adjacent transistors, and extends into a greater depth compared with the transistor structure in FIG. 1. Due to this new configuration, the interfering electric charges "e−" may travel a longer distance in order to migrate from one of the node contacts 203 to another, achieving an amelioration of electric leakage between adjacent memory cells.

Figure 3:
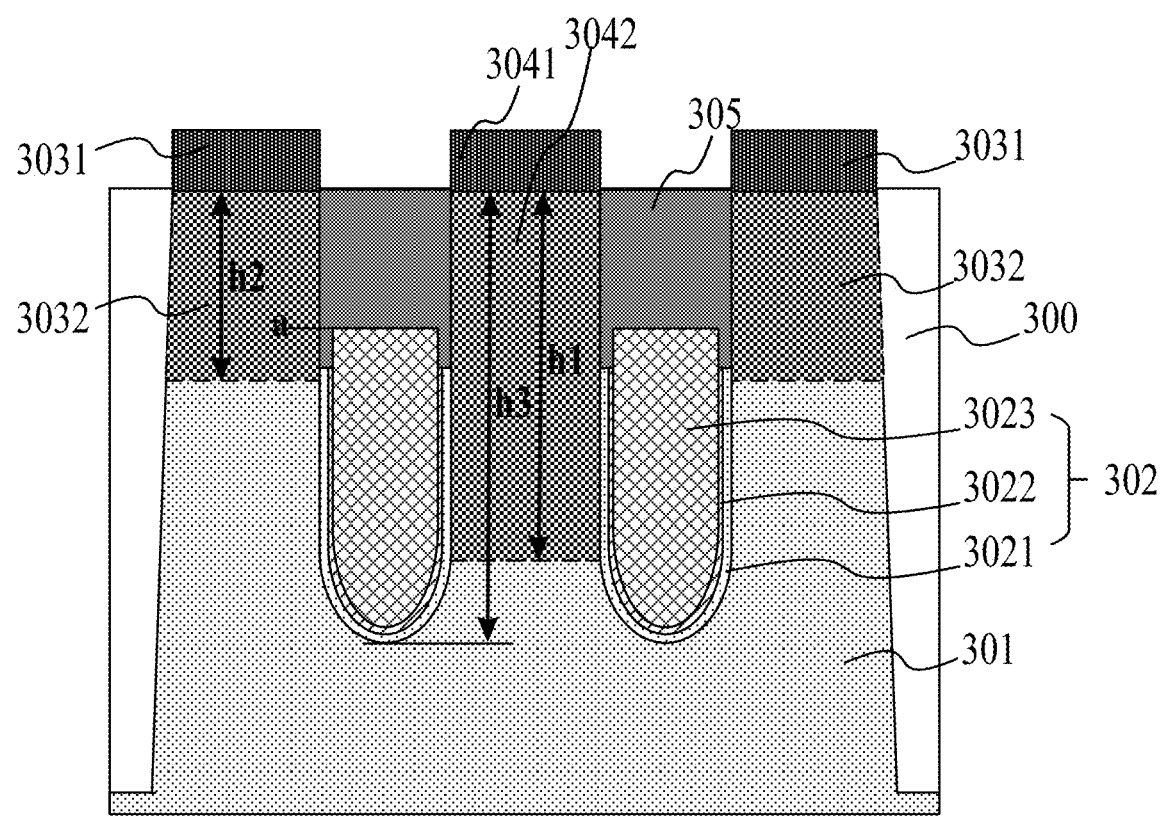
FIG. 3 schematically illustrates a semiconductor memory device according to some embodiments of the present disclosure.

Referring to FIG. 3, the present disclosure also provides a semiconductor memory device. As shown in FIG. 3, the semiconductor memory device may include: an active area 301; multiple word lines buried in and crossing the active area 301; and a bit line located on the active area 301.

The active area 301 includes at least two transistors embedded therein. Each of the transistors includes a gate structure 302 formed within the active area 301 and integrated with a corresponding word line. Each of the transistors includes a source region and a drain region located on two sides of its corresponding gate structure 302. Each of the source regions of the at least two transistors has a node connect 3031 connectable to a capacitor. The drain region has a bit line contact 3041 connectable to the bit line. The bit line contact 3041 is shared by two adjacent transistors.

Each of the gate structures 302 extends inwardly into or is embedded into the active area 301. The drain region includes an inward-extending first ion implantation layer 3042 and the source regions include inward-extending second ion implantation layers 3032. The depth "h1" (also referred to as the first depth) of the first ion implantation layer 3042 is greater than the depth "h2" (also referred to as the second depth) of the second ion implantation layer 3032 so that a J-shaped transistor channel is formed.

In some embodiments, the first ion implantation layer 3042 and the second ion implantation layers 3032 may each have a concentration gradually decreasing from the surface inwardly. For example, the concentration of either ion implantation layer 3042, 3032 may decrease with the depth from the surface of the layer 3042, 3032. The concentration has the highest value at the surface and the lowest value at the bottom of the layer 3042, 3032, and a gradient may be pre-defined for the decrease of the concentration of either ion implantation layer 3042, 3032.

In some embodiments, the first ion implantation layer 3042 may be more heavily doped than the second ion implantation layers 3032. The first ion implantation layer 3042 and the second ion implantation layers 3032 may each be formed by implanting into the surface of the active area 301 a dose of dopant of a conductivity type opposite to that of the active area 301 and causing the implanted dose of dopant to diffuse downwardly or inwardly from the surface. In some embodiments of the present disclosure, the first ion implantation layer 3042 and the second ion implantation layers 3032 may be N-doped, while a bottom region of the active area 301 other than the first and second ion-implanted layers 3042, 3032 may be P-doped.

In some embodiments, the depth "h3" of the gate structures 302 in the active area 301 may be greater than the first depth "h1" of the first ion implantation layer 3042 and hence also greater than the second depth "h2" of the second ion implantation layers 3032.

The gate structures 302 may be multi-layer structures. For example, each gate structure 302 may include one or more of a gate dielectric layer 3021, a metal liner 3022 and an gate electrode 3023, in the order from the exterior to the interior. The gate dielectric layer 3021 may be fabricated from a dielectric material or thermal oxide with a high dielectric constant, and the gate electrode 3023 from a metal such as tungsten. The materials used to make the layers of the gate structures 302 may be properly selected and combined based on various practical work functions.

In some embodiments, the bottom of the first ion implantation layer 3042 is deeper than a top of the gate structure 302. In addition, a side surface of the first ion implantation layer 3042 overlaps with a side surface of the gate structure 302 to form a first overlapping area. For example, the side surface of the first ion implantation layer 3042 may overlap with a portion of the exterior gate dielectric layer 3021 of the gate structure 302 and thus the first overlapping area may be formed. In another example, the side surface of the first ion implantation layer 3042 may overlap with a portion of the metal liner 3022 of the gate structure 302, forming the first overlapping area.

Similarly, the bottom of the second ion implantation layer 3032 is deeper than the top of the gate structure 302. A side surface of the second ion implantation layer 3032 overlaps with another side surface of the gate structure 302 to form a second overlapping area. For example, the side surface of the second ion implantation layer 3032 may overlap with a portion of the exterior gate dielectric layer 3021 of the gate structure 302 and thus the second overlapping area may be formed. In another example, the side surface of the second ion implantation layer 3032 may overlap with a portion of the metal liner 3022 of the gate structure 302, forming the second overlapping area. In some embodiments, the first overlapping area is larger than the second overlapping area.

In some embodiments, an insulating cap layer 305 may be formed on the surface of each of the gate structures 302. The insulating cap layer 305 may cover the tops of the gate dielectric layer 3021, the metal liner 3022 and the gate electrode 3023 of a gate structure 302. The top of the gate dielectric layer 3021 may be flush with the top of the metal liner 3022. The top of the gate electrode 3023 may be higher than the tops of the gate dielectric layer 3021 and the metal liner 3022 such that the gate electrode protrudes into the insulating cap layer 305. The active area 301 may be surrounded by shallow trench isolations (STIs) 300.

Figure 4:
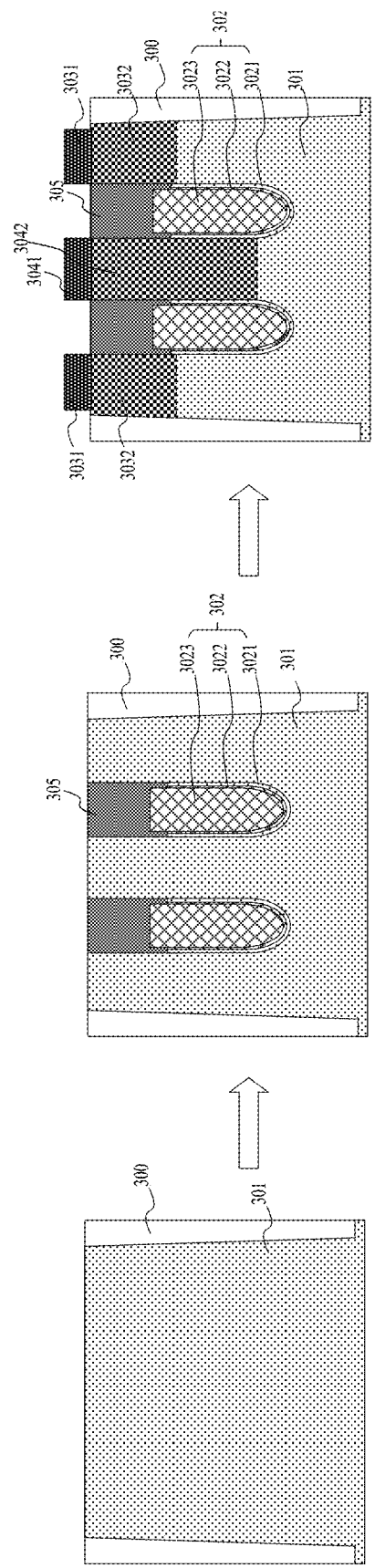
FIG. 4 is a diagram illustrating a process for fabricating a semiconductor memory device in accordance with some embodiments of the present disclosure.

The above semiconductor memory device may be fabricated by a process shown in FIG. 4. Referring to FIG. 4, a process for fabricating a semiconductor memory device is illustrated in accordance with some embodiments of the present disclosure.

At first, STIs 300 may be formed to define a plurality of active areas 301, followed by formation of a P-well within each of the active areas 301 through ion implantation (IMP) or other methods.

Next, buried word lines may be fabricated and integrated with the gate structures 302.

In some embodiments, a plurality of trenches, which extend along a predetermined direction, may be formed in the active areas 301 by etching, followed by sequential deposition of desired materials, including those for forming the gate dielectric layers and the gate electrodes. Excessive materials may then be etched away to form the buried word lines in the bottom of the trenches. The gate structures 302 are multi-layer structures sunk within the active areas 301. Subsequently, insulating cap layers 305 may be deposited on the embedded word lines (i.e., the gate structures) and fill the trenches. A chemical mechanical polishing (CMP) process may then be performed to planarize the surface of the active areas 301. The structure and materials of the gate structures 302 may be adjusted according to practical needs.

In following steps, an N-type dopant may be implanted into both sides of each of the gate structures 302 with different doses and caused to diffuse downwardly from the surface of the active areas 301 so as to form asymmetric diffusion junctions, i.e., the first ion implantation layers 3042 and the second ion implantation layers 3032. The dopant doses for the first ion implantation layers 3042 and the second ion implantation layers 3032 are not particularly limited herein and can be properly selected according to various practical needs.

Finally, on the first ion implantation layers 3042 and the second ion implantation layers 3032, the node contacts 303 and the bit line contacts 304 may be formed, respectively.

The node contacts 303 and the bit line contacts 304 may be connected to a memory cell's capacitors and bit lines, respectively.

In summary, in the semiconductor memory device, the recessed gate structures provide inwardly curved channels, so that the lengths of the channels can be effectively increased. Further, the multi-layer gate structure can reduce high electric field effects at the gates and reduce electric leakage. Additionally, sandwiching the gates between the unique asymmetric diffusion junctions can enlarge the travel distance of the interfering electric charges from the word line of one transistor to the node contact of the adjacent transistor, thereby ameliorating electric leakage between adjacent memory cells and mitigating the problem of bit line failures. Therefore, the present disclosure has effectively overcome the various drawbacks of the existing solutions and has a high value in industrial use.

The foregoing embodiments are presented merely to explain the principles and benefits of the present disclosure exemplarily and are not intended to limit the disclosure in any sense. Any person of ordinary skills in the art can make modifications or changes to those embodiments without departing from the spirit and scope of the disclosure. Accordingly, all equivalent modifications or changes made by those of ordinary skills in the art without departing from the spirit and teachings disclosed herein are intended to be embraced by the present disclosure.

What is claimed is:

1. A transistor for a semiconductor memory device, comprising:
    an active area having a plurality of trenches and a substrate surface, the trenches having openings oriented toward the substrate surface;
    a plurality of gate structures embedded in the plurality of trenches of the active area, wherein the substrate surface comprises source regions located on outer sides of the gate structures and a drain region located between the gate structures;
    a plurality of node contacts each disposed on one of the source regions; and
    a bit line contact disposed on the drain region and connectable to a bit line of the semiconductor memory device, wherein the node contacts share the bit line contact through the gate structures adjacent to the node contacts respectively,
    wherein the drain region of the active area comprises a first ion implantation layer extending inwardly from the bit line contact, and wherein each of the source regions of the active area comprises a second ion implantation layer extending inwardly from the one of the node contacts disposed on the each of the source regions, and wherein a first depth of the first ion implantation layer is greater than a second depth of the second ion implantation layer,
    and wherein each of the first ion implantation layer and the second ion implantation layer has a doping concentration decreasing from a surface thereof inwardly and gradually with a gradient, the doping concentration being the highest at the surface thereof, and the doping concentration of the first ion implantation layer is higher than the doping concentration of the second ion implantation layer,
    wherein each of the gate structures comprises, in an order from exterior to interior, a metal liner and an gate electrode, with an insulating cap formed on the gate structure, wherein a top of the gate electrode is higher than a top of the metal liner so that the gate electrode protrudes into the insulating cap and is surrounded by the insulating cap, a side surface of the first ion implantation layer overlaps with at least a portion of the metal liner to form a first overlapping area, a side surface of the second ion implantation layer overlaps with at least a portion of the metal liner to form a second overlapping area smaller than the first overlapping area.

2. The transistor of claim 1, wherein each of the first ion implantation layer and the second ion implantation layer is doped with an N-type dopant, and wherein a bottom region of the active area other than the first and second ion implantation layers is doped with a P-type dopant.

3. The transistor of claim 1, wherein a depth of each of the gate structures in the active area is greater than each of the first depth of the first ion implantation layer and the second depth of the second ion implantation layer.

4. The transistor of claim 1, wherein each of the gate structures further comprises a gate dielectric layer on an exterior of the metal liner.

5. A semiconductor memory device, comprising:
an active area, a plurality of word lines buried in and crossing the active area, and a bit line located on the active area,
wherein at least two transistors are embedded in the active area, each of the transistors comprising a plurality of gate structures embedded in the active area and integrated with one of the plurality of word lines, each of the transistors comprising a source region located on an outer side of the gate structure and a drain region located between gate structures of adjacent transistors, the source region having a top connectable to a capacitor, the drain region having a top connectable to the bit line, two adjacent ones of the transistors sharing a bit line contact connected to the bit line, and
wherein the drain region comprises a first ion implantation layer extending inwardly from the top of the drain region, and wherein the source region comprises a second ion implantation layer extending inwardly from the top of the source region, a first depth of the first ion implantation layer being greater than a second depth of the second ion implantation layer so as to provide a J-shaped transistor channel,
and wherein each of the first ion implantation layer and the second ion implantation layer has a doping concentration decreasing from a surface thereof inwardly and gradually with a gradient, the doping concentration being the highest at the surface thereof, and the doping concentration of the first ion implantation layer is higher than the doping concentration of the second ion implantation layer,
wherein each of the gate structures comprises, in an order from exterior to interior, a metal liner and an gate electrode, with an insulating cap formed on the gate structure, wherein a top of the gate electrode is higher than a top of the metal liner so that the gate electrode protrudes into the insulating cap and is surrounded by the insulating cap, a side surface of the first ion implantation layer overlaps with at least a portion the metal liner to form a first overlapping area, a side surface of the second ion implantation layer overlaps with at least a portion of the metal liner to form a second overlapping area smaller than the first overlapping area.

6. The semiconductor memory device of claim 5, wherein each of the first ion implantation layer and the second ion implantation layer is doped with an N-type dopant, and wherein a bottom region of the active area other than the first and second ion implantation layers is doped with a P-type dopant.

7. The semiconductor memory device of claim 5, wherein a depth of each of the gate structures in the active area is greater than each of the first depth of the first ion implantation layer and the second depth of the second ion implantation layer.

8. The semiconductor memory device of claim 5, wherein each of the gate structures further comprises a gate dielectric layer on an exterior of the metal liner.

9. The semiconductor memory device of claim 8, wherein the insulating cap layer covers tops of the gate dielectric layer, the metal liner and the gate electrode, the top of the gate dielectric layer being flush with the top of the metal liner, the top of the gate electrode being higher than the top of the gate dielectric layer, and the top of the gate electrode protruding into the insulating cap layer.

10. A transistor structure of a semiconductor memory device, comprising:
an active area having a plurality of trenches and a substrate surface, the trenches having openings oriented toward the substrate surface;
a plurality of gate structures embedded in the plurality of trenches of the active area, wherein the substrate surface comprises source regions located on outer sides of the gate structures and a drain region located between the gate structures;
a plurality of node contacts each disposed on one of the source regions;
a bit line contact disposed on the drain region and connectable to a bit line of the semiconductor memory device, wherein the node contacts share the bit line contact through the gate structures adjacent to the node contacts respectively,
wherein the drain region of the active area comprises a first ion implantation layer extending inwardly from the bit line contact, wherein the first ion implantation layer has a flat bottom, and wherein each of the source regions of the active area comprises a second ion implantation layer extending inwardly from the one of the node contacts disposed on the each of the source regions, wherein a first depth of the first ion implantation layer is greater than a second depth of the second ion implantation layer, and wherein each of the first ion implantation layer and the second ion implantation layer has a doping concentration decreasing from a surface thereof inwardly and gradually with a gradient, the doping concentration being the highest at the surface thereof,
wherein each of the gate structures comprises, in an order from exterior to interior, a metal liner and an gate electrode, with an insulating cap formed on the gate structure, wherein a top of the gate electrode is higher than a top of the metal liner so that the gate electrode protrudes into the insulating cap and is surrounded by the insulating cap, a side surface of the first ion implantation layer overlaps with at least a portion the metal liner to form a first overlapping area, a side surface of the second ion implantation layer overlaps with at least a portion of the metal liner to form a second overlapping area smaller than the first overlapping area.

11. The transistor structure of claim 10, wherein the doping concentration of the first ion implantation layer is higher than the doping concentration of the second ion implantation layer.

12. The transistor structure of claim 10, wherein each of the first ion implantation layer and the second ion implantation layer is doped with an N-type dopant, and wherein a bottom region of the active area other than the first and second ion implantation layers is doped with a P-type dopant.

13. The transistor structure of claim 10, wherein a depth of each of the gate structures in the active area is greater than each of the first depth of the first ion implantation layer and the second depth of the second ion implantation layer.

14. The transistor structure of claim 10, wherein each of the gate structures further comprises a gate dielectric layer on an exterior of the metal liner.

15. The transistor structure of claim 10, wherein the bottom of the first ion implantation layer is deeper than a top of the gate structure.

16. The transistor structure of claim 15, wherein the bottom of the second ion implantation layer is deeper than the top of the gate structure.

17. The transistor structure of claim 10, wherein the second ion implantation layer has a flat bottom.

18. A semiconductor memory device, comprising:
an active area, a plurality of word lines buried in and crossing the active area, and a bit line located on the active area,
wherein at least two transistors are embedded in the active area, each of the transistors comprising a gate structure embedded in the active area and integrated with one of the plurality of word lines, each of the transistors comprising a source region located on an outer side of the gate structure and a drain region located between gate structures of adjacent transistors, the source region having a top connectable to a capacitor, the drain region having a top connectable to the bit line, two adjacent ones of the transistors sharing a bit line contact connected to the bit line, and
wherein the drain region comprises a first ion implantation layer extending inwardly from the top of the drain region, and wherein the bottom of the first ion implantation layer is flat, and wherein the source region comprises a second ion implantation layer extending inwardly from the top of the source region, a first depth of the first ion implantation layer being greater than a second depth of the second ion implantation layer so as to form a J-shaped transistor channel, and wherein each of the first ion implantation layer and the second ion implantation layer has a doping concentration decreasing from a surface thereof inwardly and gradually with a gradient, the doping concentration being the highest at the surface thereof,
wherein each of the gate structures comprises, in an order from exterior to interior, a metal liner and an gate electrode, with an insulating cap formed on the gate structure, wherein a top of the gate electrode is higher than a top of the metal liner so that the gate electrode protrudes into the insulating cap and is surrounded by the insulating cap, a side surface of the first ion implantation layer overlaps with at least a portion the metal liner to form a first overlapping area, a side surface of the second ion implantation layer overlaps with at least a portion of the metal liner to form a second overlapping area smaller than the first overlapping area.

19. The semiconductor memory device of claim 18, wherein the doping concentration of the first ion implantation layer is higher than the doping concentration of the second ion implantation layer.

20. The semiconductor memory device of claim 18, wherein each of the first ion implantation layer and the second ion implantation layer is doped with an N-type dopant, and wherein a bottom region of the active area other than the first and second ion implantation layers is doped with a P-type dopant.

21. The semiconductor memory device of claim 18, wherein a depth of each of the gate structures in the active area is greater than each of the first depth of the first ion implantation layer and the second depth of the second ion implantation layer.

22. The semiconductor memory device of claim 18, wherein each of the gate structures further comprises a gate dielectric layer on an exterior of the metal liner.

23. The semiconductor memory device of claim 22, wherein the insulating cap layer covers tops of the gate dielectric layer, the metal liner and the gate electrode, the top of the gate dielectric layer being flush with the top of the metal liner, the top of the gate electrode being higher than the top of the gate dielectric layer, and the top of the gate electrode protruding into the insulating cap layer.

24. The semiconductor memory device of claim 18, wherein the bottom of the first ion implantation layer is deeper than a top of the gate structure.

25. The semiconductor memory device of claim 24, wherein the bottom of the second ion implantation layer is deeper than the top of the gate structure.

26. The semiconductor memory device of claim 18, wherein the second ion implantation layer has a flat bottom.

* * * * *